United States Patent
Kim et al.

(10) Patent No.: US 10,061,190 B2
(45) Date of Patent: Aug. 28, 2018

(54) MASK FOR EXTREME ULTRAVIOLET LITHOGRAPHY PROCESS AND METHOD OF FABRICATING THE SAME

(71) Applicant: INDUSTRY-UNIVERSITY COOPERATION FOUNDATION HANYANG UNIVERSITY (IUCF-HYU), Seoul (KR)

(72) Inventors: Jung Sik Kim, Seongnam-si (KR); Jinho Ahn, Seoul (KR); Seongchul Hong, Seoul (KR); Hyun Min Song, Uiwang-si (KR); Jae Uk Lee, Yangsan-si (KR); Seung Min Lee, Busan (KR); Jung Hwan Kim, Seoul (KR)

(73) Assignee: IUCF-HYU(INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 14/825,572

(22) Filed: Aug. 13, 2015

(65) Prior Publication Data

US 2016/0357099 A1    Dec. 8, 2016

(30) Foreign Application Priority Data

Jun. 4, 2015    (KR) .......................... 10-2015-0079159

(51) Int. Cl.
G03F 1/22    (2012.01)
G03F 1/26    (2012.01)
G03F 1/24    (2012.01)

(52) U.S. Cl.
CPC ................. G03F 1/22 (2013.01); G03F 1/24 (2013.01); G03F 1/26 (2013.01)

(58) Field of Classification Search
None
See application file for complete search history.

(56) References Cited

U.S. PATENT DOCUMENTS 6,986,974 B2    1/2006 Han et al.
2005/0214652 A1*    9/2005 Vernon .................... G03F 1/30
430/5

(Continued)

FOREIGN PATENT DOCUMENTS

JP    2009-147200 A    7/2009
KR    1020100127676 A    12/2010
(Continued)

OTHER PUBLICATIONS

Sangsul Lee, et al; "Improved imaging properties of thin attenuated phase shift masks for extreme ultraviolet lithography", J. Vac. Sci. Technol. B 31(2), Mar./Apr. 2013; 6 pages.

(Continued)

*Primary Examiner* — Stephen Rosasco
(74) *Attorney, Agent, or Firm* — Ladas & Parry LLP (57) ABSTRACT

A mask for an extreme ultraviolet (EUV) lithography process is provided. The mask includes a substrate, a reflection layer including first material layers and second material layers which are alternately and repeatedly stacked on the substrate, a capping layer on the reflection layer, and a phase shift layer and an absorber layer sequentially stacked on the capping layer. Sidewalls of the phase shift layer and the absorber layer may be oblique to a top surface of the capping layer.

19 Claims, 7 Drawing Sheets

(56) References Cited

U.S. PATENT DOCUMENTS

2010/0304277 A1* 12/2010 Oh .................. B82Y 10/00
430/5
2014/0268091 A1* 9/2014 Lu ...................... G03F 1/22
355/77

FOREIGN PATENT DOCUMENTS

| KR | 20110009375 A | 1/2011 |
| KR | 20130087011 A | 8/2013 |

OTHER PUBLICATIONS

Hyun Min Song, et al; "Influence of sidewall angle of absorber stack during fabrication of half-lone phase shift mask for EUVL", 1 page, Conference of Next Generaton Lithography, Apr. 1-3, 2015, COEX, Seoul, Korea.

* cited by examiner

MASK FOR EXTREME ULTRAVIOLET LITHOGRAPHY PROCESS AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2015-0079159, filed on Jun. 4, 2015, in the Korean Intellectual Property Office, the disclosure of which is hereby incorporated by reference in its entirety.

BACKGROUND

The inventive concepts relate to a mask for an extreme ultraviolet lithography process and a method of fabricating the same. More particularly, the inventive concepts relate to a mask for an extreme ultraviolet lithography process, which includes an absorber layer an oblique sidewall and a phase shift layer having an oblique sidewall, and a method of fabricating the same.

The reduction of the minimum feature of a device has reduced a cost per function and has improved the functionality of the device at the same time, and thus, a semiconductor industry has been steadily developed. The minimum feature of the device had been reduced at a rate of 70% every three years in history of the semiconductor industry, and recently this reduction cycle of the minimum feature of the device has been reduced to two years. In addition, the cost per function has been reduced at a mean rate of 25% to 30% every year. This trend is called 'Moore's law'. The development of a lithography process technique transferring an image of a smaller size has been the core of a device miniaturization technique corresponding to a semiconductor growth engine continued in accordance with the trend for the last 45 years.

As described above, the lithography process directly affects the miniaturization and the integration density of the semiconductor device. Integrated circuit (IC) chips having the minimum features of 38 nm had been mass-produced in 2008, and IC chips having the minimum features of 30 nm had been mass-produced in 2010.

A lithography process may use extreme ultraviolet (EUV) corresponding to an electromagnetic wave between the x-ray and the ultraviolet to fabricate semiconductor devices having fine features. Semiconductor devices having the minimum features of 20 nm may be fabricated using the EUV light source.

Meanwhile, since the EUV is absorbed in most of materials and air, the EUV lithography process may not use a transmission mask but may use a reflective mask with respect to the EUV having a wavelength band of 13.5 nm.

SUMMARY

Embodiments of the inventive concepts may provide a high-reliable mask for an extreme ultraviolet (EUV) lithography process and a method of fabricate the same.

Embodiments of the inventive concepts may also provide a mask for a EUV lithography process, of which a sidewall angle of a phase shift layer and an absorber layer is controlled, and a method of fabricate the same.

Embodiments of the inventive concepts may also provide a mask for a EUV lithography process, which has a normalized image log slope (NILS) value that is controlled, and a method of fabricate the same.

Embodiments of the inventive concepts may also provide a mask for a EUV lithography process, which is capable of improving a process margin, and a method of fabricate the same.

Embodiments of the inventive concepts may also provide a mask for a EUV lithography process, which is capable of improving a process yield, and a method of fabricate the same.

In one aspect, a mask for a EUV lithography process may include a substrate, a reflection layer including first material layers and second material layers which are alternately and repeatedly stacked on the substrate, a capping layer on the reflection layer, and a phase shift layer and an absorber layer sequentially stacked on the capping layer. Sidewalls of the phase shift layer and the absorber layer may be oblique to a top surface of the capping layer.

In an embodiment, an angle between a vertical line of the top surface of the capping layer and the sidewalls of the phase shift layer and the absorber layer may be equal to or less than 10 degrees.

In an embodiment, a normalized image log slope (NILS) value may be the maximum value when the angle between the vertical line of the top surface of the capping layer and the sidewalls of the phase shift layer and the absorber layer is 10 degrees.

In an embodiment, if the angle between the vertical line of the top surface of the capping layer and the sidewalls of the phase shift layer and the absorber layer is greater than 10 degrees, a normalized image log slope (NILS) value may decrease as the angle increases.

In an embodiment, if the angle between the vertical line of the top surface of the capping layer and the sidewalls of the phase shift layer and the absorber layer is equal to or less than 0 degrees, the NILS value may increase as the angle increases In an embodiment, a normalized image log slope (NILS) value and a critical dimension (CD) bias value may be controlled according to an angle between a vertical line of the top surface of the capping layer and the sidewalls of the phase shift layer and the absorber layer.

In an embodiment, the sidewall of the phase shift layer may be coplanar with the sidewall of the absorber layer.

In an embodiment, a width of a structure consisting of the phase shift layer and the absorber layer may become progressively greater toward the top surface of the capping layer.

In an embodiment, a width of a structure consisting of the phase shift layer and the absorber layer may become progressively less toward the top surface of the capping layer.

In an embodiment, a refractive index of the phase shift layer may be substantially equal to a refractive index of the absorber layer, and an absorption coefficient of the phase shift layer may be different from an absorption coefficient of the absorber layer.

In an embodiment, a sum of thicknesses of the phase shift layer and the absorber layer may be 40 nm.

In an embodiment, the thickness of the phase shift layer and the thickness of the absorber layer may be controlled while maintaining 40 nm of the total thickness of the phase shift layer and the absorber layer, thereby controlling a reflectivity.

In another aspect, a method of fabricating a mask for an extreme ultraviolet (EUV) lithography process may include alternately and repeatedly stacking first material layers and second material layers on a substrate to form a reflection layer, forming a capping layer on the reflection layer, forming a phase shift layer on the capping layer, forming an absorption layer on the phase shift layer, and successively patterning the absorption layer and the phase shift layer to form an absorber layer and a phase shift layer which have sidewalls oblique to a top surface of the capping layer.

In an embodiment, a normalized image log slope (NILS) value and a critical dimension (CD) bias value may be controlled according to an angle between a vertical line of the top surface of the capping layer and the sidewalls of the phase shift layer and the absorber layer.

In still another aspect, a mask for an extreme ultraviolet (EUV) lithography process may include a substrate, a reflection layer disposed on the substrate and reflecting an irradiated extreme ultraviolet (EUV), a capping layer disposed on the reflection layer to protect the reflection layer, a phase shift layer disposed on the capping layer and having a sidewall inclined to a vertical line of a top surface of the capping layer, and an absorber layer disposed on the phase shift layer and having a sidewall inclined to the vertical line of the top surface of the capping layer. The phase shift layer may modulate a phase of the irradiated EUV, and the absorber layer may absorb the irradiated EUV. A normalized image log slope (NILS) value and a critical dimension (CD) bias value may be controlled according to an angle between the vertical line of the top surface of the capping layer and the sidewalls of the phase shift layer and the absorber layer.

In an embodiment, the phase shift layer and the absorber layer may have a trapezoid-shaped cross section or a reverse trapezoid-shaped cross section.

In an embodiment, a sum of thicknesses of the phase shift layer and the absorber layer may be 40 nm, the thickness of the phase shift layer may be equal to or less than 35 nm, and the thickness of the absorber layer may be equal to or greater than 5 nm.

In an embodiment, the angle between the vertical line of the top surface of the capping layer and the sidewalls of the phase shift layer and the absorber layer may be equal to or less than 10 degrees.

In an embodiment, the phase shift layer and the absorber layer may be formed of materials different from each other. A refractive index of the phase shift layer may be substantially equal to a refractive index of the absorber layer, and an absorption coefficient of the phase shift layer may be different from an absorption coefficient of the absorber layer.

In an embodiment, the minimum width of the phase shift layer may be equal to the maximum width of the absorber layer; or the maximum width of the phase shift layer may be equal to the minimum width of the absorber layer.

BRIEF DESCRIPTION OF THE DRAWINGS

The inventive concepts will become more apparent in view of the attached drawings and accompanying detailed description.

DETAILED DESCRIPTION OF THE EMBODIMENTS

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Furthermore, descriptions to known functions or elements related in explanation of embodiments of the inventive concepts may be omitted to clarify the features of the inventive concepts.

Figure 1:
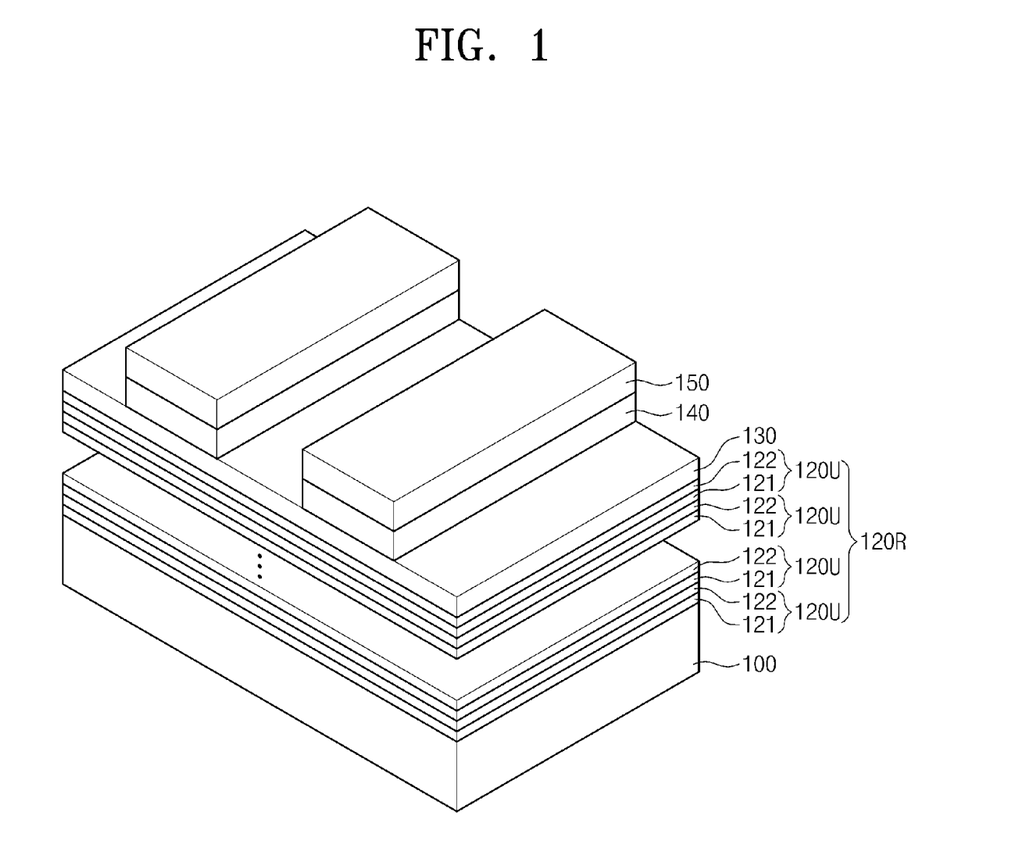
FIG. 1 is a view illustrating a mask for an extreme ultraviolet (EUV) lithography process according to an embodiment of the inventive concepts.

FIG. 1 is a view illustrating a mask for an extreme ultraviolet (EUV) lithography process according to an embodiment of the inventive concepts.

Referring to FIG. 1, a mask for a EUV lithography process according to an embodiment of the inventive concepts may include a substrate 100, a reflection layer 120R on the substrate 100, a capping layer 130 on the reflection layer 120R, a phase shift layer 140 on the capping layer 130, and an absorber layer 150 on the phase shift layer 140.

The reflection layer 120R may include a plurality of unit layers 120U stacked on the substrate 100. Thicknesses of the unit layers 120U may be equal to each other.

Each of the unit layers 120U may include a first material layer 121 on the substrate 100 and a second material layer 122 on the first material layer 121. In other word, the reflection layer 120R may include the first material layers 121 and the second material layers 122 which are alternately and repeatedly stacked on the substrate 100.

A refractive index of the first material layer 121 may be different from a refractive index of the second material layer 122. According to an embodiment, the refractive index of the first material layer 121 may be greater than the refractive index of the second material layer 122. For example, the first material layer 121 may include silicon (Si), and the second material layer 122 may include molybdenum (Mo).

According to an embodiment, a thickness of the first material layer 121 may be equal to a thickness of the second material layer 122. For example, each of the first and second material layers 121 and 122 may be in a range of 3.5 nm to 3.6 nm, and a thickness of the unit layer 120U may be in a range of 7.0 nm to 7.2 nm. When the thicknesses of the first and second material layers 121 and 122 are equal to each other as described above, the thickness of the first material layer 121 may be 50 percent of a total thickness of the unit layer 120U.

Alternatively, in another embodiment, the thickness of the first material layer 121 may be different from the thickness of the second material layer 122.

The capping layer 130 may be formed on the reflection layer 120R to protect the reflection layer 120R. The capping layer 130 may be formed of a different material from the first and second material layers 121 and 122 included in the reflection layer 120R. For example, the capping layer 130 may be formed of rubidium (Rb). A thickness of the capping layer 130 may be thinner than that of each of the first and second material layers 121 and 122. For example, the thickness of the capping layer 130 may be 2.5 nm.

The phase shift layer 140 and the absorber layer 150 may define an absorption region and a reflection region of the mask for a EUV lithography process according to an embodiment of the inventive concepts. In detail, one region where the phase shift layer 140 and the absorber layer 150 are disposed may be defined as the absorption region to which a EUV is absorbed, and another exposed region where the phase shift layer 140 and the absorber layer 150 are not disposed may be defined as the reflection region from which the EUV is reflected.

A refractive index of the phase shift layer 140 may be substantially equal to a refractive index of the absorber layer 150. According to an embodiment, the phase shift layer 140 may be formed of molybdenum (Mo) having a refractive index of 0.9238, and the absorber layer 150 may be formed of tantalum nitride (TaN) having a refractive index of 0.926. Thus, even though thicknesses of the phase shift layer 140 and the absorber layer 150 are adjusted or controlled in a state where a sum of the thicknesses of the phase shift layer 140 and the absorber layer 150 is maintained at 40 nm, a phase difference between the absorption region and the reflection region may be maintained at 180 degrees.

In addition, the phase shift layer 140 and the absorber layer 150 may have the refractive indexes substantially equal to each other as described above but may have absorption coefficients different from each other. According to an embodiment, as described above, the phase shift layer 140 may be formed of molybdenum (Mo) having an absorption coefficient of 0.0064, and the absorber layer 150 may be formed of tantalum nitride (TaN) having an absorption coefficient of 0.0436. Thus, a reflectivity of the mask for a EUV lithography process can be controlled while maintaining the phase difference (i.e., 180 degrees) between the absorption and reflection regions by the method of controlling the thicknesses of the phase shift layer 140 and the absorber layer 150 in the state where the sum of the thicknesses of the phase shift layer 140 and the absorber layer 150 is maintained at 40 nm. As a result, the thicknesses of the phase shift layer 140 and the absorber layer 150 may be adjusted or controlled to provide the mask for a EUV lithography process, which has the reflectivity controlled according to a shape and a size of a pattern to be transferred.

The phase shift layer 140 and the absorber layer 150 may have sidewalls which are oblique to a top surface of the capping layer 130 or are oblique to a top surface of the reflection layer 120R if the capping layer 130 is omitted. Hereinafter, the phase shift layer 140 and the absorber layer 150 included in the mask for a EUV lithography process according to an embodiment of the inventive concepts will be described in more detail with reference to FIGS. 2 and 3.

Figure 2:
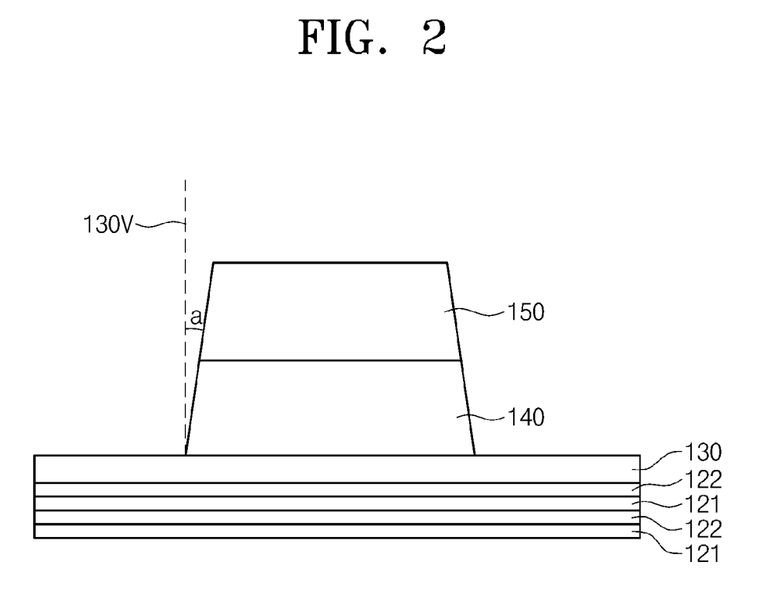
FIGS. 2 and 3 are views illustrating sidewall angles of a phase shift layer and an absorber layer of a mask for a EUV lithography process according to an embodiment of the inventive concepts.
Figure 3:
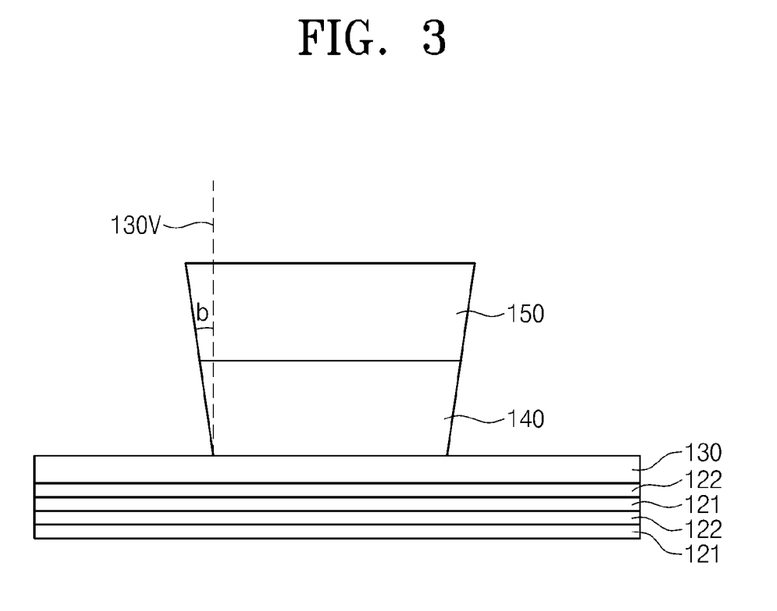

FIGS. 2 and 3 are views illustrating sidewall angles of a phase shift layer and an absorber layer of a mask for a EUV lithography process according to an embodiment of the inventive concepts.

Referring to FIGS. 2 and 3, a vertical line 130V vertical to the top surface of the capping layer 130 is defined. The top surface of the capping layer 130 may be substantially flat.

The sidewalls of the phase shift layer 140 and the absorber layer 150 may have a predetermined angle with respect to the vertical line 130V. According to an embodiment, a normalized image log slope (NILS) value of a horizontal pattern of the mask for a EUV lithography process may be controlled according to the angle a or b between the vertical line 130V of the capping layer 130 and the sidewalls of the phase shift layer 140 and the absorber layer 150. In more detail, if the angle a or b is greater than 10 degrees, the NILS value of the horizontal pattern of the mask for a EUV lithography process may decrease as the angle a or b increases. On the other hand, if the angle a or b is equal to or less than 10 degrees, the NILS value of the horizontal pattern of the mask for a EUV lithography process may increase as the angle a or b increases. Thus, the maximum value of the angle a or b between the vertical line 130V and the sidewalls of the phase shift layer 140 and the absorber layer 150 may be 10 degrees.

In addition, a critical dimension (CD) bias value of the mask for a EUV lithography process may be controlled according to the angle a or b between the vertical line 130V of the capping layer 130 and the sidewalls of the phase shift layer 140 and the absorber layer 150. In more detail, the CD bias value may decrease as the angle a or b increases.

Forming the phase shift layer 140 and the absorber layer 150 may include forming a phase shift layer on the capping layer 130, forming an absorption layer on the phase shift layer, and successively patterning the absorption layer and the phase shift layer to form the absorber layer 150 and the phase shift layer 140 which have the sidewalls oblique to the top surface of the capping layer 130. The absorption layer and the phase shift layer may be patterned by the same process as described above, so the sidewall of the phase shift layer 140 may be coplanar with the sidewall of the absorber layer 150.

A cross section of the phase shift layer 140 and the absorber layer 150 may have a trapezoidal shape, as illustrated in FIG. 2. In other word, a width of a structure consisting of the phase shift layer 140 and the absorber layer 150 may become progressively greater toward the top surface of the capping layer 130 and/or the reflection layer 120R. In this case, the minimum width of the phase shift layer 140 may be equal to the maximum width of the absorber layer 150.

According to an embodiment, a source power may be controlled in the etching process of the absorption layer and the phase shift layer to form the phase shift layer 140 and the absorber layer 150 which have the trapezoidal shape. In detail, if the source power is increased during the etching process, the number of ions constituting plasma may be increased. Thus, etch by-products may be piled up on a lower portion of the phase shift layer 140. In other word, the lower portion of the phase shift layer 140 and a lower portion of the absorber layer 150 may be insufficiently etched by the etch by-products, so the phase shift layer 140 and the absorber layer 150 may be formed to have the trapezoidal shape.

Alternatively, in another embodiment, an operating pressure may be controlled in the etching process of the absorption layer and the phase shift layer to form the phase shift layer 140 and the absorber layer 150 which have the trapezoidal shape. In detail, if the operating pressure is increased during the etching process, the number of ions colliding with each other may be increased, so a vertical-directional etch rate may be reduced. In other word, energy of the ions may be reduced, so etch rates of the lower portions of the phase shift layer 140 and the absorber layer 150 may be reduced. As a result, the phase shift layer 140 and the absorber layer 150 may be formed to have the trapezoidal shape.

In still another embodiment, a gas flow rate may be controlled in the etching process to form the phase shift layer 140 and the absorber layer 150 which have the trapezoidal shape. In detail, if a flow rate of an inert gas for physical etching is increased as compared with a flow rate of a reactive gas for chemical etching during the etching process, a mask (e.g., a photoresist pattern) on the absorber layer 150 may be rapidly etched. Thus, an upper portion of the phase shift layer 140 and an upper portion of the absorber layer 150 may be further etched to form the phase shift layer 140 and the absorber layer 150 which have the trapezoidal shape.

Unlike the above description, a cross section of the phase shift layer 140 and the absorber layer 150 may have a reverse-trapezoidal shape as illustrated in FIG. 3. In other word, a width of the structure consisting of the phase shift layer 140 and the absorber layer 150 may become progressively less toward the top surface of the capping layer 130 and/or the reflection layer 120. In this case, the maximum width of the phase shift layer 140 may be equal to the minimum width of the absorber layer 150.

According to an embodiment, a process time of the etching process may be controlled to form the phase shift layer 140 and the absorber layer 150 which have the reverse-trapezoidal shape. In detail, if the process time of the etching process is increased, ions may be scattered on the top surface of the capping layer 130 to further etch a lower portion of the phase shift layer 140 and a lower portion of the absorber layer 150. Thus, the phase shift layer 140 and the absorber layer 150 may be formed to have the reverse-trapezoidal shape.

The mask for a EUV lithography process according to an embodiment of the inventive concepts may include the capping layer 130 on the reflection layer 120R, and the phase shift layer 140 and the absorber layer 150 sequentially stacked on the capping layer 130. The sidewalls of the phase shift layer 140 and the absorber layer 150 may have a predetermined gradient with respect to the top surface of the capping layer 130. The NILS value and the CD bias value may be controlled or adjusted according to the gradient of the sidewalls of the phase shift layer 140 and the absorber layer 150, and thus, it is possible to provide the high-reliable mask for a EUV lithography process, which is capable of improving a process margin and a process yield, and the method of fabricating the same.

Evaluation results of characteristics of the mask for a EUV lithography process will be described hereinafter.

Figure 4:
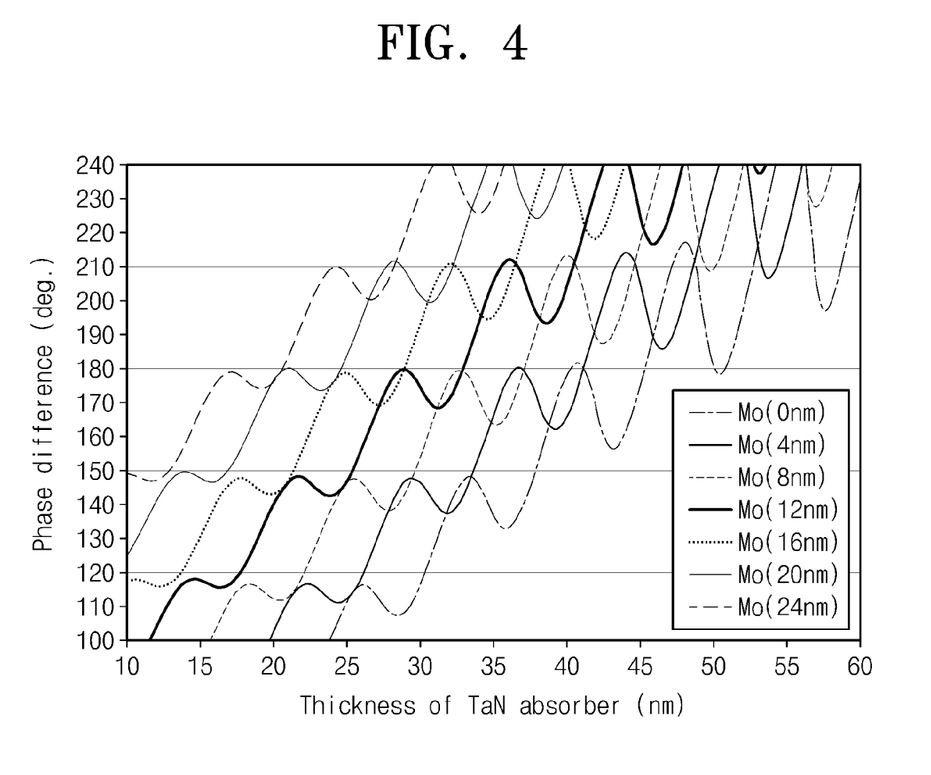
FIG. 4 is a graph illustrating a phase difference according to a thickness of an absorber layer of a mask for a EUV lithography process according to an embodiment of the inventive concepts.

FIG. 4 is a graph illustrating a phase difference according to a thickness of an absorber layer of a mask for a EUV lithography process according to an embodiment of the inventive concepts.

Referring to FIG. 4, the phase different between the absorption region and the reflection region was measured while varying in the mask for a EUV lithography process, which had a molybdenum (Mo) phase shift layer and a tantalum nitride (TaN) absorber layer.

According to the measurement result, as shown in FIG. 4, the phase difference between the absorption and reflection regions was maintained at 180 degrees even though thicknesses of the Mo phase shift layer and the TaN absorber layer were changed in the state where the sum of the thicknesses of the Mo phase shift layer and the TaN absorber layer was maintained at 40 nm.

Figure 5:
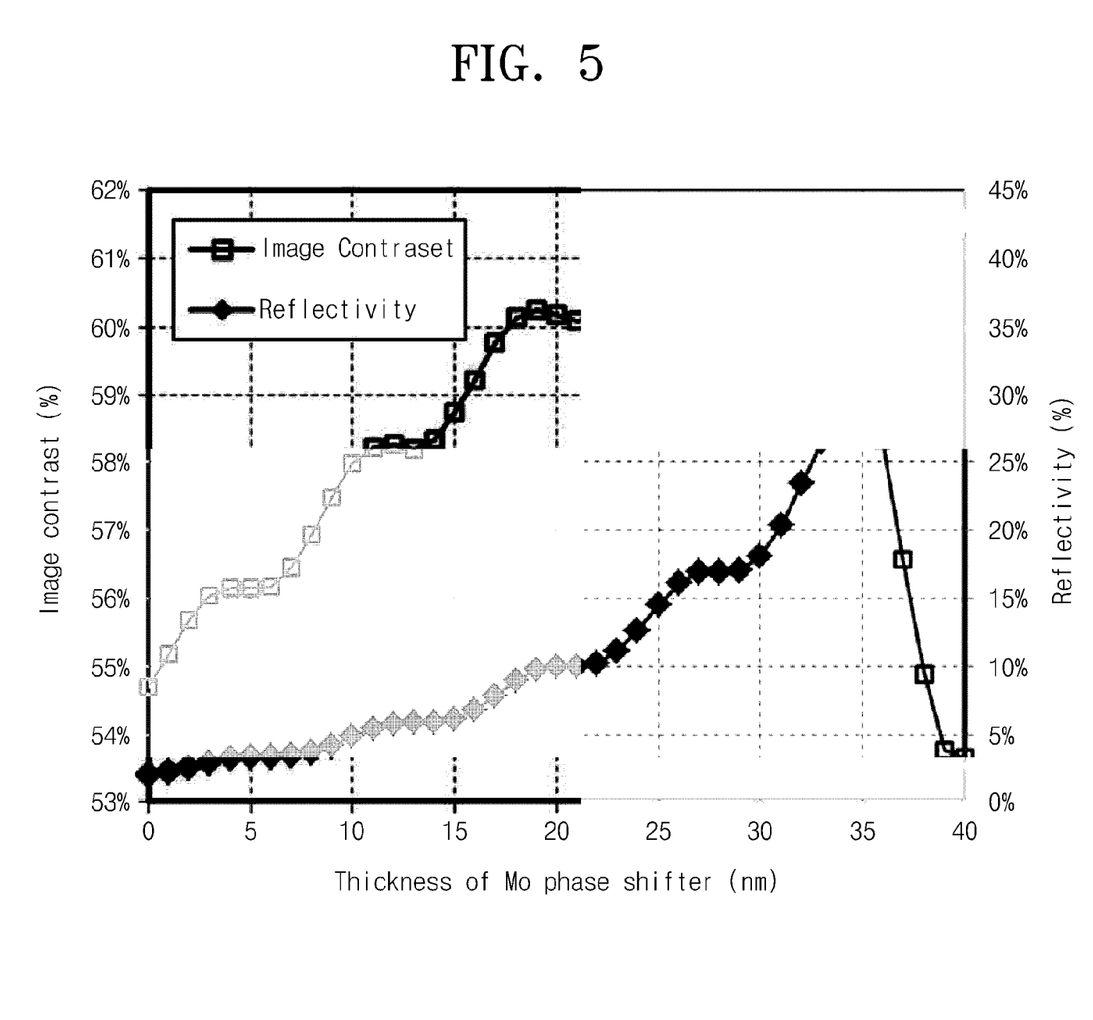
FIG. 5 is a graph illustrating a reflectivity and an image contrast measured according to a thickness of a phase shift layer of a mask for a EUV lithography process according to an embodiment of the inventive concepts.

FIG. 5 is a graph illustrating a reflectivity and an image contrast measured according to a thickness of a phase shift layer of a mask for a EUV lithography process according to an embodiment of the inventive concepts.

Referring to FIG. 5, in the mask having the Mo phase shift layer and the TaN absorber layer, a reflectivity and an image contrast according to the thickness of Mo phase shift layer were measured while maintaining the state where the sum of the thicknesses of the Mo phase shift layer and the TaN absorber layer was 40 nm.

According to the measurement result, as shown in FIG. 5, the image contrast was controlled and the reflectivity increased as the thickness of Mo phase shift layer increased in the state where the a total thickness of the Mo phase shift layer and the TaN absorber layer was maintained at 40 nm. In other word, when the phase shift layer and the absorber layer have the refractive indexes substantially equal to each other but have the absorption coefficients different from each other as described in the above embodiment of the inventive concepts, the thicknesses of the phase shift layer and the absorber layer are controlled in the state where the total thickness of the phase shift layer and the absorber layer is maintained at 40 nm, and thus, the reflectivity and/or the image contrast can be controlled while maintaining the phase difference (e.g., 180 degrees) between the absorption region and the reflection region.

In addition, the image contrast is remarkably reduced when the thickness of the Mo phase shift layer is greater than 35 nm, as shown in FIG. 5. In other word, the remarkable reduction of the image contrast can be effectively prevented when the thickness of the Mo phase shift layer is controlled to be equal to or less than 35 nm and the thickness of the TaN absorber layer is controlled to be equal to or greater than 5 nm in the state where the sum of the thicknesses of the Mo phase shift layer and the TaN absorber layer is maintained at 40 nm.

Figure 6:
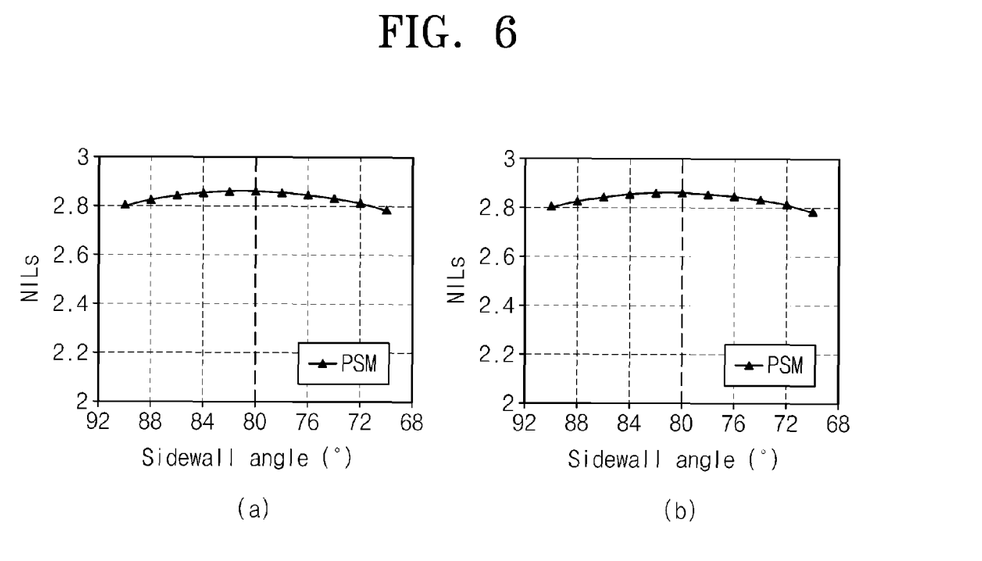
FIG. 6 is a scanning electron microscope (SEM) image of phase shift and absorber layers having a trapezoidal shape in a mask for a EUV lithography process according to an embodiment of the inventive concepts.
Figure 7:
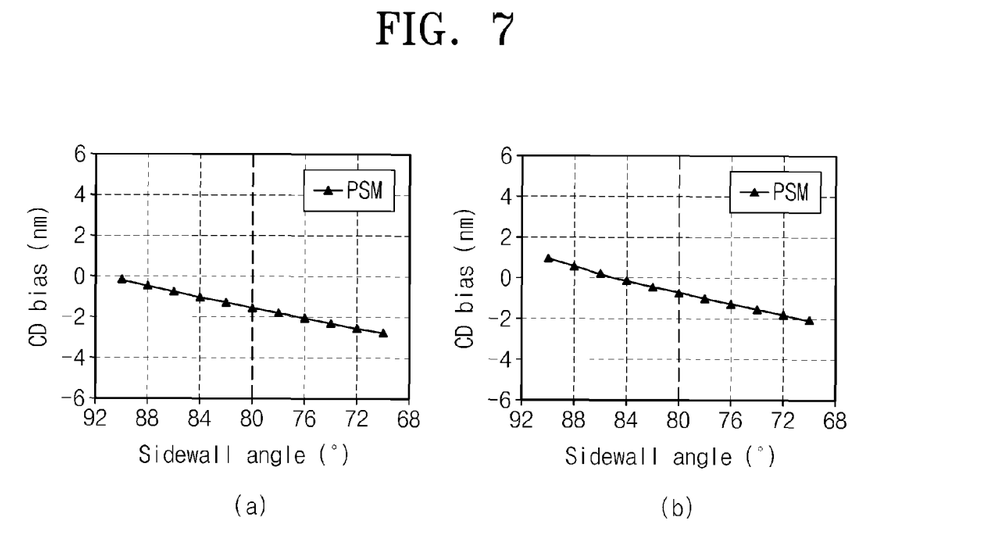
FIG. 7 is a graph illustrating a normalized image log slope (NILS) value measured according to a sidewall angle of phase shift and absorber layers having a trapezoidal shape in a mask for a EUV lithography process according to an embodiment of the inventive concepts.
Figure 8:
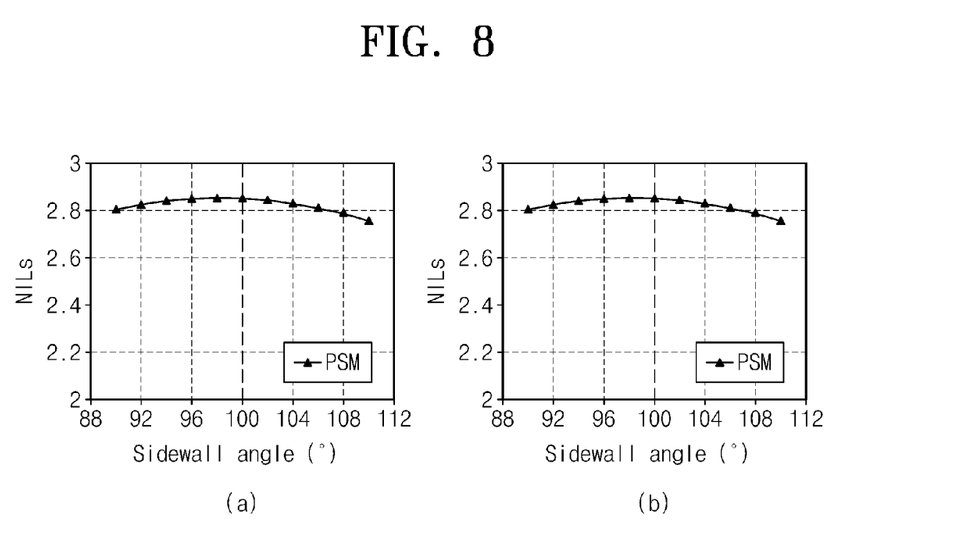
FIG. 8 is a graph illustrating a critical dimension (CD) bias value measured according to a sidewall angle of phase shift and absorber layers having a trapezoidal shape in a mask for a EUV lithography process according to an embodiment of the inventive concepts.

FIG. 6 is a scanning electron microscope (SEM) image of phase shift and absorber layers having a trapezoidal shape in a mask for a EUV lithography process according to an embodiment of the inventive concepts. FIG. 7 is a graph illustrating a normalized image log slope (NILS) value measured according to a sidewall angle of phase shift and absorber layers having a trapezoidal shape in a mask for a EUV lithography process according to an embodiment of the inventive concepts. FIG. 8 is a graph illustrating a critical dimension (CD) bias value measured according to a sidewall angle of phase shift and absorber layers having a trapezoidal shape in a mask for a EUV lithography process according to an embodiment of the inventive concepts.

Referring to FIGS. 6 to 8, a Rb capping layer was formed on a reflection layer including Mo layers and Si layers which were alternately and repeatedly stacked, and then a Mo phase shift layer and a TaN absorber layer, having the trapezoidal shape illustrated in FIG. 6, were formed on the Rb capping layer. By this method, a plurality of masks for a EUV lithography process was fabricated. At this time, sidewall angles of the Mo phase shift layers and the TaN absorber layers of the plurality of masks were different from each other. Thereafter, the NILS value and the CD bias value according to the sidewall angle of the Mo phase shift layer and the TaN absorber layer were measured. A reference designator (a) of FIG. 7 is a graph showing the measured NILS value of the left side of a horizontal pattern. A reference designator (b) of FIG. 7 is a graph showing the measured NILS value of the right side of the horizontal pattern. A reference designator (a) of FIG. 8 is a graph showing the measured CD bias value of a vertical pattern, and a reference designator (b) of FIG. 8 is a graph showing the measured CD bias value of the horizontal pattern. The sidewall angle of the phase shift layer and the absorber layer means the angle between the vertical line of the top surface of the capping layer and the sidewalls of the phase shift layer and the absorber layer, as described with reference to FIGS. 2 and 3.

As shown in FIG. 7, when the sidewall angle of the Mo phase shift layer and the TaN absorber layer is equal to or less than 10 degrees, the NILS value increases as the sidewall angle increases. When the sidewall angle is greater than 10 degrees, the NILS value decreases as the sidewall angle increases. In other word, when the sidewall angle of the Mo phase shift layer and the TaN absorber layer is 10 degrees, the NILS value is the maximum value.

As shown in FIG. 8, the CD bias values of the vertical pattern and the horizontal pattern decrease as the sidewall angle of the Mo phase shift layer and the TaN phase shift layer increases.

Figure 9:
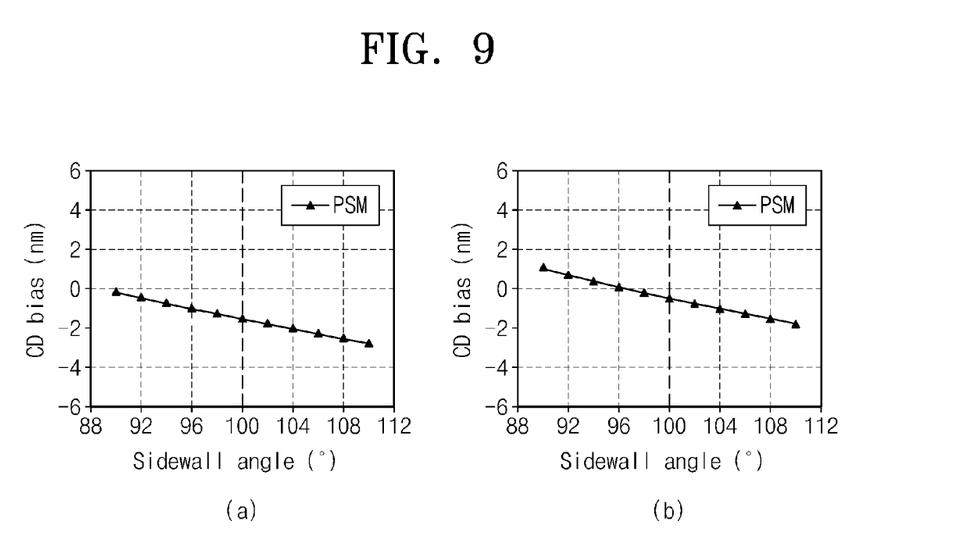
FIG. 9 is a SEM image of phase shift and absorber layers having a reverse-trapezoidal shape in a mask for a EUV lithography process according to an embodiment of the inventive concepts.
Figure 10:
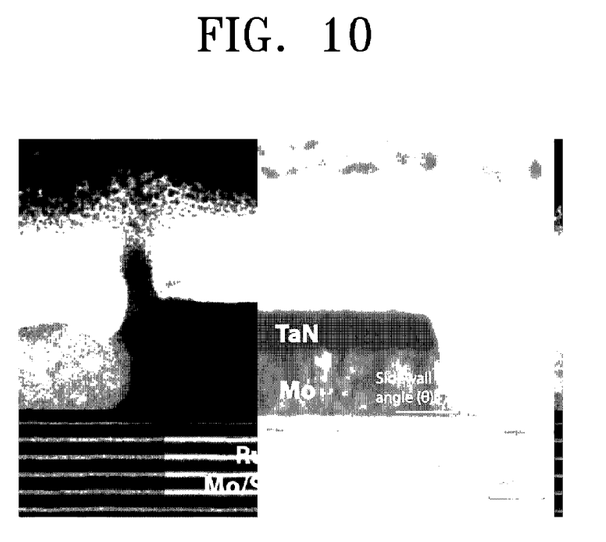
FIG. 10 is a graph illustrating an NILS value measured according to a sidewall angle of phase shift and absorber layers having a reverse-trapezoidal shape in a mask for a EUV lithography process according to an embodiment of the inventive concepts.
Figure 11:
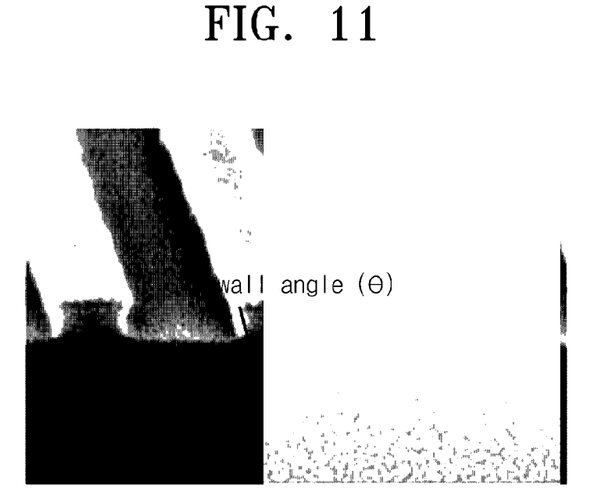
FIG. 11 is a graph illustrating a CD bias value measured according to a sidewall angle of phase shift and absorber layers having a reverse-trapezoidal shape in a mask for a EUV lithography process according to an embodiment of the inventive concepts.

FIG. 9 is a SEM image of phase shift and absorber layers having a reverse-trapezoidal shape in a mask for a EUV lithography process according to an embodiment of the inventive concepts. FIG. 10 is a graph illustrating an NILS value measured according to a sidewall angle of phase shift and absorber layers having a reverse-trapezoidal shape in a mask for a EUV lithography process according to an embodiment of the inventive concepts. FIG. 11 is a graph illustrating a CD bias value measured according to a sidewall angle of phase shift and absorber layers having a reverse-trapezoidal shape in a mask for a EUV lithography process according to an embodiment of the inventive concepts.

Referring to FIGS. 9 to 11, a Rb capping layer was formed on a reflection layer including Mo layers and Si layers which were alternately and repeatedly stacked, and then a Mo phase shift layer and a TaN absorber layer, having the reverse-trapezoidal shape illustrated in FIG. 9, were formed on the Rb capping layer. By this method, a plurality of masks for a EUV lithography process was fabricated. At this time, sidewall angles of the Mo phase shift layers and the TaN absorber layers of the plurality of masks were different from each other. Thereafter, the NILS value and the CD bias value according to the sidewall angle of the Mo phase shift layer and the TaN absorber layer were measured. A reference designator (a) of FIG. 10 is a graph showing the measured NILS value of the left side of a horizontal pattern. A reference designator (b) of FIG. 10 is a graph showing the measured NILS value of the right side of the horizontal pattern. A reference designator (a) of FIG. 11 is a graph showing the measured CD bias value of a vertical pattern, and a reference designator (b) of FIG. 11 is a graph showing the measured CD bias value of the horizontal pattern.

As shown in FIG. 10, when the sidewall angle of the Mo phase shift layer and the TaN absorber layer is equal to or less than 10 degrees, the NILS value increases as the sidewall angle increases. When the sidewall angle is greater than 10 degrees, the NILS value decreases as the sidewall angle increases. In other word, when the sidewall angle of the Mo phase shift layer and the TaN absorber layer is 10 degrees, the NILS value is the maximum value.

As shown in FIG. 11, the CD bias values of the vertical pattern and the horizontal pattern decrease as the sidewall angle of the Mo phase shift layer and the TaN phase shift layer increases.

As a result, according to an embodiment of the inventive concepts, the angle between the vertical line of the top surface of the capping layer and the sidewalls of the phase shift layer and the absorber layer is controlled to be equal to or less than 10 degrees as described with reference to FIGS. 6 to 11, and thus, the NILS value can be improved and the CD bias value can be reduced.

The mask for a EUV lithography process includes the capping layer on the reflection layer, and the phase shift layer and the absorber layer sequentially stacked on the capping layer. The sidewalls of the phase shift layer and the absorber layer may be oblique to the top surface of the capping layer. The NILS value and the CD bias value may be controlled according to the gradient of the sidewalls of the phase shift layer and the absorber layer, and thus, it is possible to provide the high-reliable mask capable of improving the process margin and the process yield and the method of fabricating the same.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A mask for an extreme ultraviolet (EUV) lithography process, the mask comprising:
    a substrate;
    a reflection layer including first material layers and second material layers which are alternately and repeatedly stacked on the substrate;
    a capping layer on the reflection layer; and
    a phase shift layer and an absorber layer sequentially stacked on the capping layer, such that the phase shift layer is interposed between the capping layer and absorber layer,
    wherein sidewalk of the phase shift layer and the absorber layer are oblique to a top surface of the capping layer, and
    wherein a normalized image log slope (NILS) value and a critical dimension (CD) bias value are controlled according to an angle between a vertical line of the top surface of the capping layer and the sidewalls of the phase shift layer and the absorber layer.

2. The mask of claim 1, wherein an angle between a vertical line of the top surface of the capping layer and the sidewalk of the phase shift layer and the absorber layer is equal to or less than 10 degrees.

3. The mask of claim 2, wherein a normalized image log slope (NILS) value is the maximum value when the angle between the vertical line of the top surface of the capping layer and the sidewalk of the phase shift layer and the absorber layer is 10 degrees.

4. The mask of claim 2, wherein, if the angle between the vertical line of the top surface of the capping layer and the sidewalls of the phase shift layer and the absorber layer is greater than 10 degrees, a normalized image log slope (NILS) value decreases as the angle increases.

5. The mask of claim 4, wherein, if the angle between the vertical line of the top surface of the capping layer and the sidewalls of the phase shift layer and the absorber layer is equal to or less than 0 degrees, the NILS value increases as the angle increases.

6. The mask of claim 1, wherein the sidewall of the phase shift layer is coplanar with the sidewall of the absorber layer.

7. The mask of claim 1, wherein a width of a structure consisting of the phase shift layer and the absorber layer becomes progressively greater toward the top surface of the capping layer.

8. The mask of claim 1, wherein a width of a structure consisting of the phase shift layer and the absorber layer becomes progressively less toward the top surface of the capping layer.

9. The mask of claim 1, wherein a refractive index of the phase shift layer is substantially equal to a refractive index of the absorber layer, and
    wherein an absorption coefficient of the phase shift layer is different from an absorption coefficient of the absorber layer.

10. The mask of claim 1, wherein a sum of thicknesses of the phase shift layer and the absorber layer is 40 nm.

11. The mask of claim 10, wherein the thickness of the phase shift layer and the thickness of the absorber layer are controlled to control a reflectivity under a condition that the sum of the thicknesses of the phase shift layer and the absorber layer is maintained at 40 nm.

12. A method of fabricating a mask for an extreme ultraviolet (EUV) lithography process, the method comprising:
    alternately and repeatedly stacking first material layers and second material layers on a substrate to form a reflection layer;
    forming a capping layer on the reflection layer;
    forming a phase shift layer on the capping layer;
    forming an absorption layer on the phase shift layer; and
    successively patterning the absorption layer and the phase shift layer to form an absorber layer and a phase shift layer which have sidewalls oblique to a top surface of the capping layer.

13. The method of claim 12, wherein a normalized image log slope (NILS) value and a critical dimension (CD) bias value are controlled according to an angle between a vertical line of the top surface of the capping layer and the sidewalls of the phase shift layer and the absorber layer.

14. A mask for en extreme ultraviolet (EUV) lithography process, the mask comprising:
    a substrate;
    a reflection layer disposed on the substrate, the reflection layer reflecting an irradiated extreme ultraviolet (EUV);
    a capping layer disposed on the reflection layer to protect the reflection layer;
    a phase shift layer disposed on the capping layer, the phase shift layer having a sidewall inclined to a vertical line of a top surface of the capping layer, and the phase shift layer modulating a phase of the irradiated EUV; and an absorber layer disposed on the phase shift layer, the absorber layer having a sidewall inclined to the vertical line of the top surface of the capping layer, and the absorber layer absorbing the irradiated EUV, wherein a normalized image log slope (NILS) value and a critical dimension (CD) bias value are controlled according to an angle between the vertical line of the top surface of the capping layer and the sidewalls of the phase shift layer and the absorber layer.

15. The mask of claim 14, wherein the phase shift layer and the absorber layer have a trapezoid-shaped cross section or a reverse trapezoid-shaped cross section.

16. The mask of claim 14, wherein a sum of thicknesses of the phase shift layer and the absorber layer is 40 nm, wherein the thickness of the phase shift layer is equal to or less than 35 nm, and wherein the thickness of the absorber layer is equal to or greater than 5 nm.

17. The mask of claim 14, wherein the angle between the vertical line of the top surface of the capping layer and the sidewalls of the phase shift layer and the absorber layer is equal to or less than 10 degrees.

18. The mask of claim 14, wherein the phase shift layer and the absorber layer are formed of materials different from each other, wherein a refractive index of the phase shift layer is substantially equal to a refractive index of the absorber layer, and wherein an absorption coefficient of the phase shift layer is different from an absorption coefficient of the absorber layer.

19. The mask of claim 18, wherein the minimum width of the phase shift layer is equal to the maximum width of the absorber layer; or the maximum width of the phase shift layer is equal to the minimum width of the absorber layer.

* * * * *